United States Patent
Wada et al.

(10) Patent No.: US 11,557,499 B2
(45) Date of Patent: Jan. 17, 2023

(54) METHODS AND APPARATUS FOR PREVENTION OF COMPONENT CRACKING USING STRESS RELIEF LAYER

(71) Applicant: APPLIED MATERIALS, INC., Santa Clara, CA (US)

(72) Inventors: Yuichi Wada, Chiba (JP); Kok Wei Tan, Singapore (SG); Chul Nyoung Lee, Singapore (SG); Siew Kit Hoi, Singapore (SG); Xinxin Wang, Singapore (SG); Zheng Min Clarence Chong, Singapore (SG); Yaoying Zhong, Singapore (SG); Kok Seong Teo, Singapore (SG)

(73) Assignee: APPLIED MATERIALS, INC., Santa Clara, CA (US)

( * ) Notice: Subject to any disclaimer, the term of this patent is extended or adjusted under 35 U.S.C. 154(b) by 87 days.

(21) Appl. No.: 17/072,082

(22) Filed: Oct. 16, 2020

(65) Prior Publication Data

US 2022/0122871 A1 Apr. 21, 2022

(51) Int. Cl.
| | |
|---|---|
| *H01J 37/32* | (2006.01) |
| *H01L 21/683* | (2006.01) |
| *C23C 4/134* | (2016.01) |
| *C23C 14/34* | (2006.01) |

(52) U.S. Cl.
CPC .......... *H01L 21/6833* (2013.01); *C23C 4/134* (2016.01); *C23C 14/34* (2013.01); *H01J 37/32477* (2013.01)

(58) Field of Classification Search
None
See application file for complete search history.

(56) References Cited

U.S. PATENT DOCUMENTS

| | | | |
|---|---|---|---|
| 6,296,727 B1 * | 10/2001 | Chang | B42F 13/0006 156/290 |
| 6,592,707 B2 * | 7/2003 | Shih | C23C 16/4404 156/345.48 |
| 6,656,535 B2 | 12/2003 | He et al. | |
| 6,899,798 B2 | 5/2005 | Weldon et al. | |

(Continued)

OTHER PUBLICATIONS

IBM Technical Disclosure Bulletin, Apr. 1991, vol. 22, Iss. 11, "Process for Safe, Efficient Cleaning of Titanium and Other Metal Deposits off Stainless Steel." (Year: 1991).*

(Continued)

*Primary Examiner* — Jason Berman
(74) *Attorney, Agent, or Firm* — Moser Taboada

(57) ABSTRACT

Methods and apparatus for protecting parts of a process chamber from thermal cycling effects of deposited materials. In some embodiments, a method of protecting the part of the process chamber includes wet etching the part with a weak alkali or acid, cleaning the part by bead blasting, coating at least a portion of a surface of the part with a stress relief layer. The stress relief layer forms a continuous layer that is approximately 50 microns to approximately 250 microns thick and is configured to preserve a structural integrity of the part from the thermal cycling of aluminum deposited on the part. The method may also include wet cleaning of the part with a heated deionized water rinse after formation of the stress relief layer.

20 Claims, 4 Drawing Sheets

(56) References Cited

U.S. PATENT DOCUMENTS

| | | | |
|---|---|---|---|
| 2003/0118731 A1* | 6/2003 | He | C23C 14/564 |
| | | | 427/430.1 |
| 2003/0227737 A1* | 12/2003 | Lue | C23C 4/126 |
| | | | 361/234 |
| 2005/0130427 A1 | 6/2005 | Won et al. | |
| 2009/0004100 A1* | 1/2009 | Umemoto | H01J 37/32871 |
| | | | 118/715 |
| 2009/0029056 A1 | 1/2009 | Hoffmann et al. | |
| 2013/0104930 A1 | 5/2013 | Shih et al. | |
| 2016/0168687 A1 | 6/2016 | Ramalingam et al. | |
| 2018/0291501 A1 | 10/2018 | Montes et al. | |
| 2020/0185203 A1 | 6/2020 | Lubomirsky et al. | |

OTHER PUBLICATIONS

International Search Report and Written Opinion for PCT/US2021/052858 dated Jan. 11, 2022.

* cited by examiner

METHODS AND APPARATUS FOR PREVENTION OF COMPONENT CRACKING USING STRESS RELIEF LAYER

FIELD

Embodiments of the present principles generally relate to semiconductor processing of semiconductor substrates.

BACKGROUND

Large scale integrated circuits (LSI) have long used aluminum as an interconnect material. When single layered wiring was used in LSI, the film thicknesses were about one micron. Advancements in technology, such as barrier metal layer use, allowed the film thicknesses to be reduced to about 0.3 micron to 0.6 micron. However, recently, the semiconductor industry has turned to requiring that the film thicknesses be increased from about 1.5 microns to about 6 microns or more in order to support advanced packaging technologies. As the film thicknesses increase, the target is depleted faster and process kit life is shortened, decreasing productivity. The inventors have observed that in aluminum deposition chambers producing increased film thicknesses, the process kit components required maintenance far more frequently than the target, causing additional downtime to replace the process kit components and then more downtime to replace the target at end of life.

Accordingly, the inventors have provided improved process kit component life, increasing production while reducing maintenance costs.

SUMMARY

Methods and apparatus for increasing the life of parts used in a process chamber are provided herein.

In some embodiments, a method of protecting a part of a process chamber includes wet etching the part with a weak alkali or acid, cleaning the part by bead blasting, coating at least a portion of a surface of the part with a stress relief layer, wherein the stress relief layer forms a continuous layer that is approximately 50 microns to approximately 250 microns thick and is configured to preserve a structural integrity of the part from a thermal cycling of aluminum deposited on the part, and wet cleaning the part with a heated deionized water rinse.

In some embodiments, the method may further include wherein the stress relief layer is formed from a material based on aluminum oxide ($Al_2O_3$), wherein a plasma spray process is used to coat the at least a portion of the surface of the part, wherein a per-hydro-poly-silazane (PHPS) process is used to coat the at least a portion of the surface of the part, wherein the part is a deposition ring formed from a ceramic material, wherein the stress relief layer forms a continuous layer that is approximately 100 microns to approximately 150 microns thick, wherein the part is an electrostatic chuck formed from a ceramic material, wherein the thermal cycling is between approximately 200 degrees Celsius and approximately 400 degrees Celsius, wherein the stress relief layer has a first adhesion threshold with aluminum deposited under a vacuum and a second adhesion threshold with the part when formed from a ceramic material and wherein the first adhesion threshold is greater than the second adhesion threshold, and/or wherein the aluminum deposited on the part exceeds a thickness of the part.

In some embodiments, a method of protecting a part of a process chamber may include coating at least a portion of a surface of the part with a stress relief layer, wherein the stress relief layer forms a continuous layer that is approximately 50 microns to approximately 250 microns thick, wherein the stress relief layer is configured to have a higher adhesion threshold for materials deposited on the stress relief layer than with underlying materials, and wherein the stress relief layer is configured to preserve a structural integrity of the part from a thermal cycling between approximately 200 degrees Celsius and approximately 400 degrees Celsius of aluminum deposited on the part.

In some embodiments, the method may further include wet etching the part with a weak alkali or acid prior to coating the part and cleaning the part by bead blasting prior to coating the part, wherein the stress relief layer is formed from a material based on aluminum oxide ($Al_2O_3$), wherein a plasma spray process using powdered aluminum oxide is used to coat the at least a portion of the surface of the part, wherein the part is a deposition ring formed from a ceramic material, wherein the stress relief layer forms a continuous layer that is approximately 100 microns to approximately 150 microns thick, wherein the part is an electrostatic chuck formed from a ceramic material, and/or wherein the stress relief layer has a first adhesion threshold with aluminum deposited under a vacuum and a second adhesion threshold with the part when formed from a ceramic material and wherein the first adhesion threshold is greater than the second adhesion threshold.

In some embodiments, an apparatus for installation into a process chamber may include a deposition ring with at least a portion of an upper surface having a stress relief layer, wherein the stress relief layer is an aluminum oxide layer of approximately 50 microns to approximately 250 microns in thickness and is configured to have a higher adhesion threshold with aluminum deposited in a vacuum than with a deposition ring material.

In some embodiments, the apparatus may further include wherein the stress relief layer is configured to reduce stresses produced by thermal cycling between approximately 200 degrees Celsius and approximately 400 degrees Celsius of aluminum deposited on the deposition ring.

Other and further embodiments are disclosed below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

Figure 1:
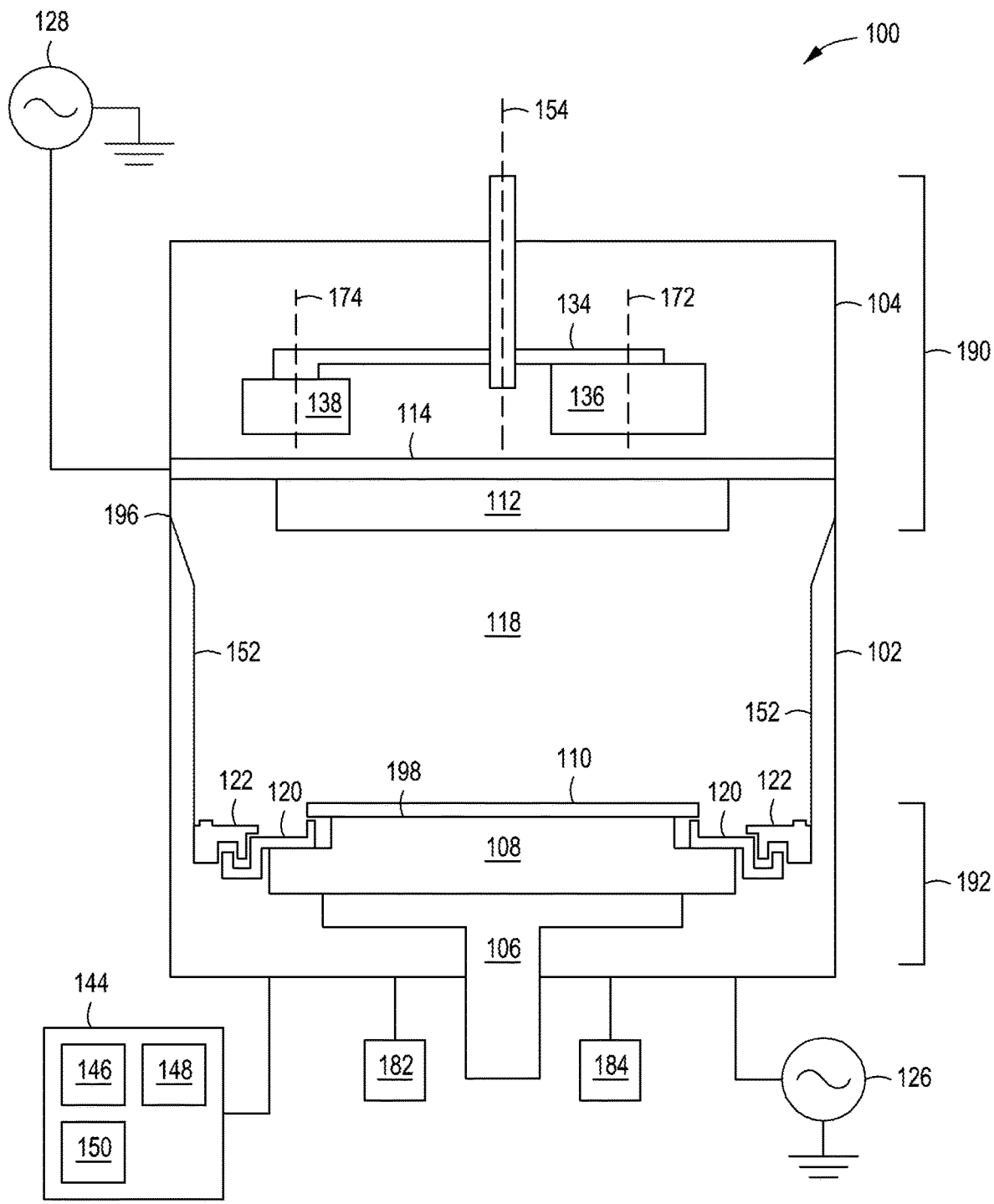
FIG. 1 depicts a cross-sectional view of a process chamber in accordance with some embodiments of the present principles.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The methods and apparatus provide a low-cost process for increasing the life of parts used in a process chamber. A stress relief layer is coated onto a part surface to achieve improved structural strength and to reduce cracking of the part to increase the life of the part, reducing maintenance. The decreased downtime increases productivity and throughput. The coating may be applied to any number of parts in a process chamber and is process transparent (does not affect the wafer performance). Kit life may be increased by as much as 40% to 100% using the methods and apparatus of the present principles. In terms of kilowatt hours, improvements may be from approximately 1800 kWh to approximately 2500 kWh or more.

A use case involving a deposition ring of a process chamber is used as an example herein, but the use case is not meant to be limiting in any manner as the coating process may be used on any chamber part to preserve the part's structural integrity over the part's life span. In the case of the deposition ring, in response to the increased deposition of aluminum, previous efforts included increasing the height of the electrostatic chuck (ESC) and reducing the thickness of an alumina ceramic deposition ring in order to make space for the extra deposition of aluminum that formed around the wafer to satisfy the target life. The inventors found that with the reduction of the deposition ring thickness and the increased aluminum deposition, cracks formed in the deposition ring when the aluminum deposition on the deposition ring was thicker than the deposition ring thickness (when the aluminum deposition thickness was approximately four to six times the thickness of the deposition ring).

The inventors also found that the cause of the cracking on the alumina deposition ring was two-fold—differences in the thermal coefficient of the thermal expansion and adhesion of aluminum (deposited material) and alumina (underlying material), and the coefficient of thermal expansion of the volume of aluminum exceeded the tension of alumina. The inventors discovered that by using a coating of aluminum oxide on the alumina material of the deposition ring, the cracking of the deposition ring was prevented. The coating adhered more strongly to the deposited aluminum than to the alumina of the deposition ring, allowing the aluminum to expand and contract with the coating independent of the alumina. In effect, the coating bonded with the aluminum deposition and de-bonded with the alumina when compression and tensile forces due to heating expansion and cooling contraction overcame the lesser adhesion threshold between the coating and the alumina.

FIG. 1 is a cross-sectional view of a PVD chamber 100 according to some embodiments. The PVD chamber 100 represents an example chamber (not intended to be limiting) in which the methods and apparatus of the present principles may be incorporated. The PVD chamber 100 may be used for the deposition of aluminum and other materials onto a wafer 110 which may contain semiconductor structures. The PVD chamber 100 includes a chamber body 102 and a source 190 that includes a magnetron assembly 104 and a target 112. The wafer 110 is supported on substrate support assembly 192 that includes an electrostatic chuck (ESC) 108 which is supported by a substrate support pedestal 106. One or more gases may be supplied from a gas source 184 into a lower part of the PVD chamber 100. A pump 182 is connected to the PVD chamber 100 for exhausting the interior of the PVD chamber 100 and to facilitate maintaining a desired pressure inside the PVD chamber 100.

At the top of a processing volume 118 is the target 112 with a backing plate 114. In some embodiments, the target 112 may be aluminum or the like. A DC power source 128 provides DC power to the target 112 via the backing plate 114 to sputter the target 112 during processing. The backing plate 114 may comprise a conductive material, such as copper-zinc, copper-chrome, or the same material as the target 112, such that DC power can be coupled to the target 112 via the backing plate 114. Alternatively, the backing plate 114 may be non-conductive and may include conductive elements (not shown) such as electrical feedthroughs or the like. The backing plate 114 may be disc shaped, rectangular, square, or any other shape that may be accommodated by the PVD chamber 100. The backing plate 114 is configured to support the target 112 such that a front surface of the target 112 opposes the wafer 110 when present. The target 112 may be coupled to the backing plate 114 in any suitable manner. For example, in some embodiments, the target 112 may be diffusion bonded to the backing plate 114.

The magnetron assembly 104 may include a first magnet 136 that travels in a first radius over the target 112 about a central axis 154 and a second magnet that travels in a second radius over the target 112 about the central axis 154. The first radius may be referred to as the inner radius and the second radius may be referred to as the outer radius. A support apparatus 134 supports the first magnet 136 and the second magnet 138 and enables the first magnet 136 and the second magnet 138 to rotate around a central axis 154. In some embodiments, the first magnet 136 may rotate about a first magnet axis 172 and/or the second magnet 138 may rotate about a second magnet axis 174. In some embodiments, the first magnet 136 and/or the second magnet 138 may comprise a plurality of individual magnets.

An RF bias power source 126 may be coupled to the substrate support assembly 192 in order to induce a bias on the wafer 110. In addition, in some embodiments, a self-bias may form on the wafer 110 during processing. For example, RF energy supplied by the RF bias power source 126 may range in frequency from about 2 MHz to about 60 MHz, for example, non-limiting frequencies such as 2 MHz, 13.56 MHz, or 60 MHz can be used. In some embodiments, the RF power may be supplied in a range from approximately 1 kW to about 20 kW. In some embodiments, the RF power supplied may be approximately 3 kW. In some embodiments, the RF power supplied may be approximately 1.9 kW. In some embodiments, DC power may be supplied to the target 112 from a DC power source 128 in a range from approximately 38 kW to approximately 50 kW. In some embodiments, the DC power source 128 may provide DC power in range from approximately 42 kW to approximately 50 kW. In some embodiments, the DC power source 128 may provide DC power in range from approximately 42 kW to approximately 60 kW. In some embodiments, the DC power source 128 may provide DC power in range from approximately 38 kW to approximately 60 kW. In other applications, the substrate support assembly 192 may be grounded or left electrically floating.

The PVD chamber 100 further includes a process kit shield or shield 152 to surround the processing volume 118 of the PVD chamber 100 and to protect other chamber components from damage and/or contamination from processing. In some embodiments, the shield 152 may be grounded at an uppermost point 196 to the chamber body to provide an RF ground return path. The shield 152 extends downwardly and may include a generally tubular portion having a generally constant diameter that generally surrounds the processing volume 118. The shield 152 extends along the walls of the chamber body 102 downwardly to below an uppermost surface 198 of an ESC 108, reaching a cover ring 122. A deposition ring 120 may be used to protect the edges of the substrate support assembly 192 including substrate support pedestal and/or the ESC 108 from deposition around the edge of the wafer 110.

A controller 144 may be provided and coupled to various components of the PVD chamber 100 to control the operation thereof. The controller 144 includes a central processing unit (CPU) 146, a memory 148, and support circuits 150. The controller 144 may control the PVD chamber 100 directly, or via computers (or controllers) associated with a particular process chamber and/or support system components. The controller 144 may be one of any form of general-purpose computer processor that can be used in an industrial setting for controlling various chambers and subprocessors. The memory, or computer readable medium, 148 of the controller 144 may be one or more of readily available memory such as random access memory (RAM), read only memory (ROM), floppy disk, hard disk, optical storage media (e.g., compact disc or digital video disc), flash drive, or any other form of digital storage, local or remote. The support circuits 150 are coupled to the CPU 146 for supporting the processor in a conventional manner. These circuits include cache, power supplies, clock circuits, input/output circuitry and subsystems, and the like. Methods to control the PVD chamber 100 and/or processes may be stored in the memory 148 as software routine that may be executed or invoked to control the operation of the PVD chamber 100 in the manner described herein. The software routine may also be stored and/or executed by a second CPU (not shown) that is remotely located from the hardware being controlled by the CPU 146.

Figure 2:
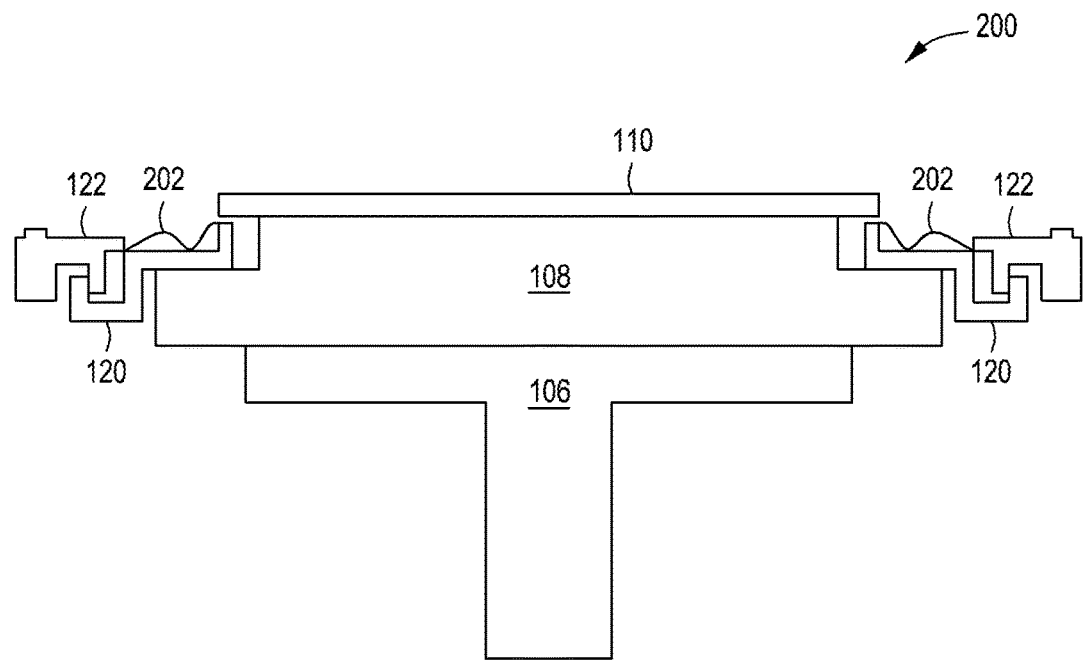
FIG. 2 depicts a cross-sectional view of substrate support assembly after aluminum deposition processes in accordance with some embodiments of the present principles.
Figure 3:
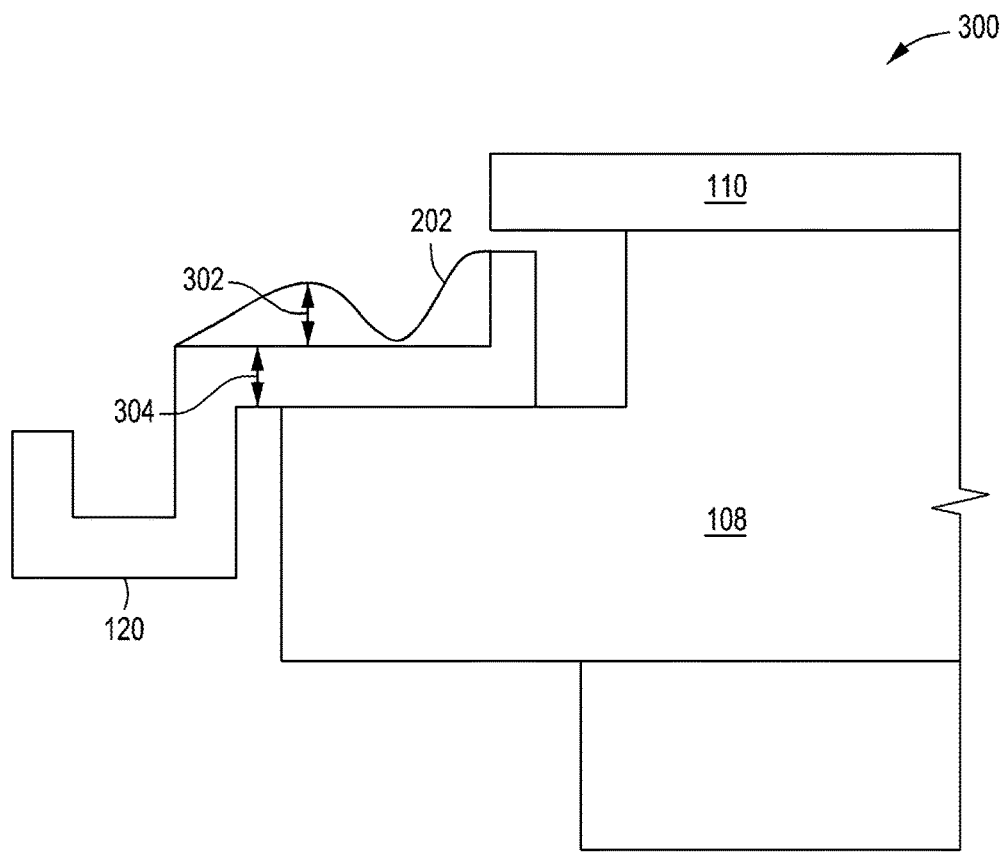
FIG. 3 depicts a cross-sectional view of a deposition ring after deposition of aluminum in accordance with some embodiments of the present principles.

FIG. 2 depicts a cross-sectional view of substrate support assembly 200 after aluminum deposition processes in accordance with some embodiments. After heavy aluminum depositions have occurred, a buildup 202 of aluminum is formed on the deposition ring 120 after several deposition processes have been performed. FIG. 3 depicts a cross-sectional view 300 of a portion of the deposition ring after the deposition of aluminum reaches a critical point, possibly inducing cracking in the deposition ring. The inventors have found that when an aluminum deposition thickness 302 and a deposition ring thickness 304 reach a ratio of approximately 0.8 or higher, the deposition ring 120 may begin cracking in one or more locations due to the thermal cycling of the aluminum during deposition processes. The coefficient of thermal expansion (CTE) of aluminum (approximately 22 ppm) is much greater than the CTE of the ceramic material (approximately 7.8 ppm) used to form the deposition ring 120.

Figure 4:
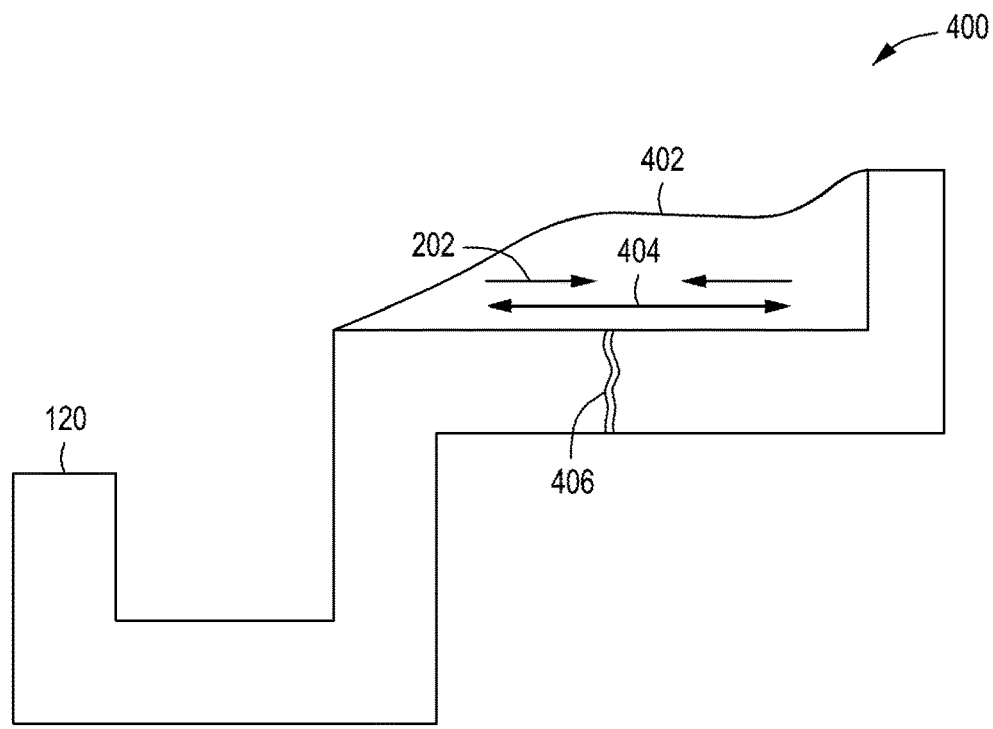
FIG. 4 depicts a cross-sectional view of a deposition ring in accordance with some embodiments of the present principles.

FIG. 4 depicts a cross-sectional view 400 of the deposition ring 120 after the heating and cooling forces of the buildup 202 of the deposited aluminum have affected the structural integrity of the deposition ring 120 and formed a crack 406. In atmospheric conditions, aluminum generally tends to have poor bonding with oxides such as alumina or aluminum oxide. In vacuum, as found in most deposition chambers, aluminum deposition bonds extremely well to surfaces that the aluminum comes into contact with during processing. Under vacuum conditions, the deposited aluminum forms a strong bond with the ceramic material of the deposition ring 120. As the aluminum is heated, the aluminum expands 404 at over three times the expansion rate of the ceramic material and causes internal stresses in the deposition ring 120. As the aluminum cools, the aluminum contracts 402 at a much greater rate than the ceramic material of the deposition ring 120. The temperature cycling eventually causes a breakdown of the structural integrity of the deposition ring 120, forming cracks.

Figure 5:
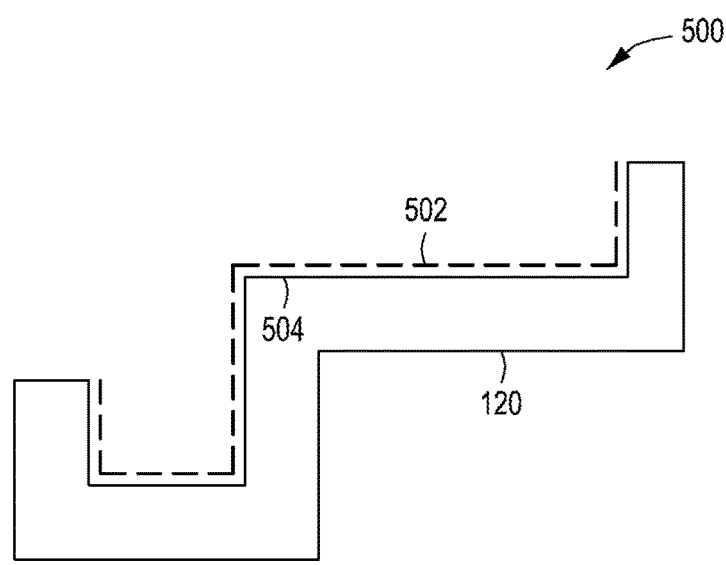
FIG. 5 depicts a cross-sectional view of a deposition ring with a stress relief layer in accordance with some embodiments of the present principles.

The inventors discovered that if a stress relief layer is formed on the deposition ring 120 prior to the deposition of the aluminum, the aluminum expansion and contraction forces of the aluminum can be prevented from breaking down the structural integrity of the deposition ring 120. FIG. 5 depicts a cross-sectional view 500 of the deposition ring 120 with a stress relief layer 502 in accordance with some embodiments. The stress relief layer 502 is applied to at least a portion of an upper surface 504 of the deposition ring 120 that would come into contact with deposition materials during process. In some embodiments, the stress relief layer 502 is applied to portions of the deposition ring 120 that may come into contact with deposited aluminum and the like. In some embodiments, the stress relief layer is formed from aluminum oxide ($Al_2O_3$). The aluminum oxide has a first adhesion threshold with the ceramic material of the deposition ring 120. The aluminum oxide has a second adhesion threshold with the aluminum when deposited in a vacuum. The second adhesion threshold is significantly greater than the first adhesion threshold. In some embodiments, the ratio of the second adhesion threshold to the first adhesion threshold is 5:1 or more. For example, in some embodiments, a stress relief layer has an adhesion threshold of approximately 3 MPa to approximately 6 MPa (first adhesion threshold) and the stress relief layer has an adhesion threshold with deposited aluminum of approximately 30 MPa (second adhesion threshold). The inventors have discovered that if the stress relief layer is formed from any material that has a higher adhesion threshold with deposited material than with any underlying material, the structural integrity of the part is preserved, extending the part's life span significantly.

Figure 6:
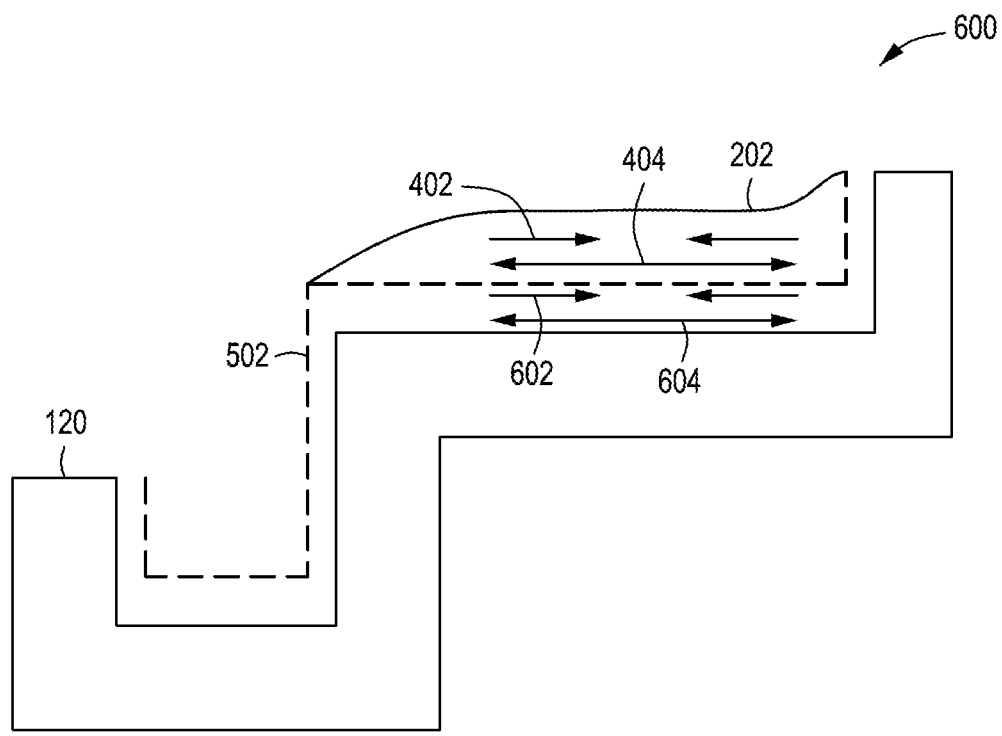
FIG. 6 depicts a cross-sectional view of a deposition ring with a stress relief layer after deposition of aluminum in accordance with some embodiments of the present principles.

FIG. 6 depicts a cross-sectional view 600 of the deposition ring 120 with the stress relief layer 502 after deposition of aluminum in accordance with some embodiments. As the buildup 202 of aluminum is heated and cooled, the thermal cycling forces expand and contract the stress relief layer 502 due to the strong bond formed between the deposited aluminum and the stress relief layer 502. The weaker bond formed between the stress relief layer 502 and the ceramic material of the deposition ring 120 is broken and allows the stress relief layer 502 to move independent of the ceramic material of the deposition ring 120, preventing internal stresses from forming and breaking down the structural integrity of the deposition ring 120. Due to the weaker bond with the underlying material, the stress relief layer 502 is allowed to expand 604 and contract 602 separately from the ceramic material of the deposition ring 120, preventing the aluminum thermal cycling from damaging the deposition ring 120.

Figure 7:
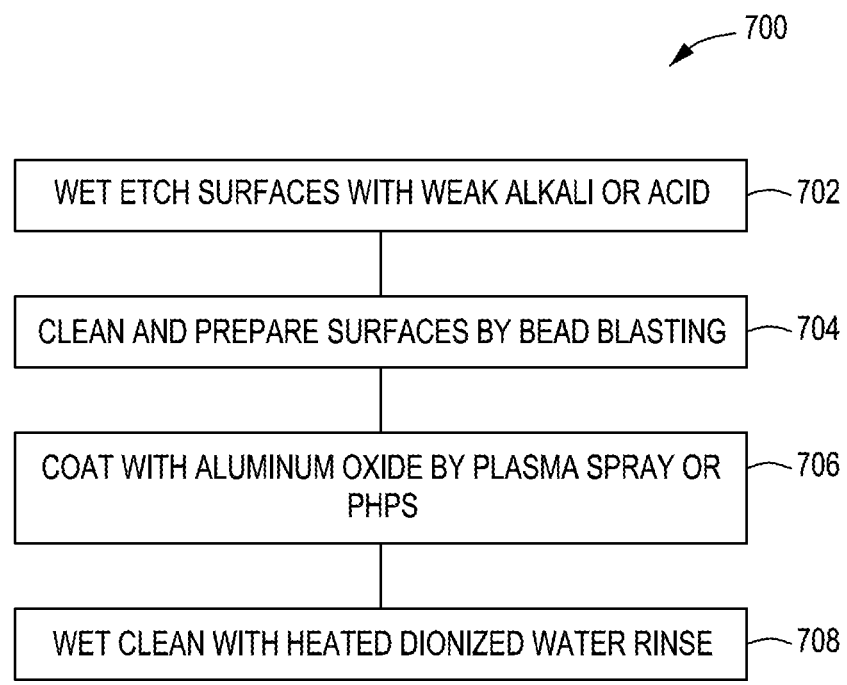
FIG. 7 is a method of applying a stress relief layer in accordance with some embodiments of the present principles.

FIG. 7 is a method 700 of applying a stress relief layer in accordance with some embodiments. In block 702, surfaces of a part that are to be coated are wet etched with a weak alkali or acid to ensure that any surface contaminants are removed. In block 704, the surfaces are cleaned and prepped by bead blasting. The bead blasting ensures that the surfaces will provide appropriate adhesion of a subsequently applied stress relief layer. In block 706, the stress relief layer is applied using any number of techniques such as, but not limited to, plasma spray coating techniques or per-hydro-poly-silazane (PHPS) coating techniques and the like. The stress relief layer is formed from any material that has a higher adhesion threshold with material deposited on the stress relief layer than with the material onto which the stress relief layer is applied, allowing stresses of the deposited material to be relieved in the stress relief layer, preserving the structural integrity of the underlying part.

In plasma spray techniques, plasma is used to spray a powdered form of material using an intense plasma flame. The material accelerates and impacts into a part surface under high pressures and temperatures. The spray comes out of the plasma spray apparatus similar to a shock wave and the high pressure of the gas of the spray material powder adheres to surfaces. In PHPS coating techniques, PHPS is used as a precursor to produce a coating that provides high quality thin films on surfaces. In some embodiments, the stress relief layer is approximately 50 microns to approximately 250 microns in thickness. In some embodiments, the stress relief layer is approximately 100 microns to approximately 150 microns in thickness. The stress relief layer is applied such that the stress relief layer is a continuous layer.

The stress relief layer is configured to preserve the structural integrity of a part of a process chamber from the thermal cycling of material deposited on the part, such as, but not limited to, aluminum and the like, during processing. In some embodiments, the stress relief layer preserves structural integrity of the part during thermal cycling between approximately 200 degrees Celsius and approximately 400 degrees Celsius. Aluminum deposition is generally performed at approximately 200 degrees Celsius or higher to ensure reliability of the aluminum interconnects formed on the wafer. Aluminum, which has a melting point of approximately 600 degrees Celsius, begins to start plastic deformation at approximately 400 degrees Celsius. Because the aluminum is in a plastic deformation state above 400 degrees Celsius, the aluminum does not add any additional stresses to any underlying materials at higher temperatures. In some embodiments, the stress relief layer is formed from a material based on aluminum oxide ($Al_2O_3$). In some embodiments, the part is a deposition ring or an electrostatic chuck and the like. The stress relief layer is formed from any material that has a higher adhesion threshold with deposited material than with any underlying material, the structural integrity of the part is preserved, extending the part's life span significantly. Environmental conditions under which the deposited materials are formed may directly affect the adhesion threshold such as the case where aluminum is deposited under vacuum. In some embodiments, the underlying material may include ceramic based materials and the like. In block 708, the stress relief layer is wet cleaned with a heated deionized water rinse to remove any residual particles. The method may be used to apply a stress relief layer on any part of the process chamber.

Embodiments in accordance with the present principles may be implemented in hardware, firmware, software, or any combination thereof. Embodiments may also be implemented as instructions stored using one or more computer readable media, which may be read and executed by one or more processors. A computer readable medium may include any mechanism for storing or transmitting information in a form readable by a machine (e.g., a computing platform or a "virtual machine" running on one or more computing platforms). For example, a computer readable medium may include any suitable form of volatile or non-volatile memory. In some embodiments, the computer readable media may include a non-transitory computer readable medium.

While the foregoing is directed to embodiments of the present principles, other and further embodiments of the principles may be devised without departing from the basic scope thereof.

The invention claimed is:

1. A method of protecting a part of a process chamber, comprising:
    wet etching a deposition ring of an electrostatic chuck with a weak alkali or acid;
    bead blasting a first uppermost surface of the deposition ring to increase adhesion of the first uppermost surface to a subsequently applied stress relief layer, wherein the deposition ring is a ceramic material;
    coating at least a portion of the first uppermost surface of the deposition ring with the stress relief layer, wherein the stress relief layer forms a continuous layer, wherein the stress relief layer has a first adhesion threshold with the ceramic material of the deposition ring, wherein the stress relief layer has a second adhesion threshold with aluminum on a second uppermost surface of the stress relief layer, and wherein a ratio of the second adhesion threshold to the first adhesion threshold is at least 5 to 1 to preserve a structural integrity of the deposition ring from a thermal cycling of aluminum deposited on the deposition ring; and
    wet cleaning the part with a heated deionized water rinse.

2. The method of claim 1, wherein the first adhesion threshold is approximately 6 MPa and the second adhesion threshold is approximately 30 MPa.

3. The method of claim 1, wherein a plasma spray process is used to coat the at least a portion of the surface of the part.

4. The method of claim 1, wherein a per-hydro-poly-silazane (PHPS) process is used to coat the at least a portion of the surface of the part.

5. The method of claim 1, wherein the deposition ring is configured to surround the electrostatic chuck in a plasma vapor deposition chamber.

6. The method of claim 1, wherein the stress relief layer forms a continuous layer that is approximately 100 microns to approximately 150 microns thick.

7. The method of claim 1, wherein the deposition ring has a kit life of approximately 2500 kWh or more.

8. The method of claim 1, wherein the thermal cycling is between approximately 200 degrees Celsius and approximately 400 degrees Celsius.

9. The method of claim 1, wherein the second adhesion threshold is an adhesion threshold of aluminum deposited in a vacuum.

10. The method of claim 1, wherein the stress relief layer maintains structural integrity of the deposition ring for an aluminum deposition thickness having a ratio of greater than 0.8 compared to a deposition ring thickness.

11. A method of protecting a part of a process chamber, comprising:
    coating at least a portion of a first uppermost surface of a deposition ring of a ceramic material with a stress relief layer, wherein the stress relief layer forms a continuous layer, wherein the stress relief layer has a first adhesion threshold with the ceramic material of the deposition ring, wherein the stress relief layer has a second adhesion threshold with aluminum on a second uppermost surface of the stress relief layer, and wherein a ratio of the second adhesion threshold to the first adhesion threshold is at least approximately 5 to 1 to preserve a structural integrity of the deposition ring from a thermal cycling below a plastic deformation temperature of aluminum deposited on the part deposition ring in a vacuum.

12. The method of claim 11, further comprising:
wet etching the part with a weak alkali or acid prior to coating the part; and
bead blasting the first uppermost surface of the deposition ring to increase adhesion of the first uppermost surface to a subsequently applied stress relief layer, wherein the deposition ring.

13. The method of claim 11, wherein the first adhesion threshold is approximately 6 MPa and the second adhesion threshold is approximately 30 MPa.

14. The method of claim 11, wherein a plasma spray process using powdered aluminum oxide is used to coat the at least a portion of the surface of the part.

15. The method of claim 11, wherein the deposition ring is configured to surround the electrostatic chuck in a plasma vapor deposition chamber.

16. The method of claim 11, wherein the stress relief layer forms a continuous layer that is approximately 100 microns to approximately 150 microns thick.

17. The method of claim 11, wherein the deposition ring is configured to surround an electrostatic chuck.

18. The method of claim 11, wherein the stress relief layer maintains structural integrity of the deposition ring for an aluminum deposition thickness having a ratio of greater than 0.8 compared to a deposition ring thickness.

19. An apparatus for installation into a process chamber, comprising:
a deposition ring of a ceramic material with at least a portion of a first uppermost surface having a stress relief layer, wherein the stress relief layer forms a continuous layer, wherein the stress relief layer has a first adhesion threshold with the ceramic material of the deposition ring, wherein the stress relief layer has a second adhesion threshold with aluminum deposited in a vacuum on a second uppermost surface of the stress relief layer, and wherein a ratio of the second adhesion threshold to the first adhesion threshold is at least 5 to 1 to preserve a structural integrity of the deposition ring from a thermal cycling of aluminum deposited on the deposition ring at temperatures of less than a plastic deformation temperature of aluminum.

20. The apparatus of claim 19, wherein the first adhesion threshold is approximately 6 MPa and the second adhesion threshold is approximately 30 MPa.

* * * * *